United States Patent [19]
Goto

[11] Patent Number: 5,093,849
[45] Date of Patent: Mar. 3, 1992

[54] CHARGE TRANSFER DEVICE AND ITS DRIVING METHOD FOR PROVIDING POTENTIAL WELLS GRADUALLY SHALLOWER TOWARD THE FINAL TRANSFER STAGE

[75] Inventor: Hiroshige Goto, Yokohama, Japan

[73] Assignee: Kabushiki Kaisha Toshiba, Kawasaki, Japan

[21] Appl. No.: 548,828

[22] Filed: Jul. 6, 1990

[30] Foreign Application Priority Data

Jul. 7, 1989 [JP] Japan .................. 1-176189

[51] Int. Cl.⁵ .................. G11C 19/28; H01L 29/78
[52] U.S. Cl. .................. 377/60; 377/62; 377/63; 357/24
[58] Field of Search .................. 377/57-63, 377/24; 307/607

[56] References Cited

U.S. PATENT DOCUMENTS

| | | | |
|---|---|---|---|
| 4,242,600 | 12/1980 | Hoffman et al. | 357/24 |
| 4,554,675 | 11/1985 | Miwada | 377/60 |
| 4,603,426 | 7/1986 | Sauer | 377/60 |
| 4,811,371 | 3/1989 | Tower | 377/60 |
| 4,873,562 | 10/1989 | Cazaux et al. | 377/61 |
| 4,878,103 | 10/1989 | Cazaux et al. | 377/61 |
| 4,992,842 | 2/1991 | Yang et al. | 377/58 |

FOREIGN PATENT DOCUMENTS 192142 7/1986 Japan .

Primary Examiner—Stanley D. Miller
Assistant Examiner—Tai V. Duong
Attorney, Agent, or Firm—Foley & Lardner

[57] ABSTRACT

A charge transfer device and its driving method are disclosed such that transfer pulses each having an ampitude substantially equal to that of transfer pulses applied to transfer electrodes at transfer stages before a plurality of successively-arranged transfer stages including a final transfer stage and DC offset levels so decreased gradually as to gradually make shallow the depth of potential wells formed under the transfer electrode toward the final transfer stage are applied to transfer electrode at successively-arranged plural transfer stages including the final stage. Further, a charge transfer device and its driving method are disclosed such that a transfer pulse having an amplitude substantially equal to that of transfer pulses applied to transfer electrodes at transfer stages before the final transfer stage and a DC offset voltage so biased as to allow the depth of potential well formed under the transfer electrodes at the final trnasfer stage to be shallower than that of potential wells formed under the transfer electrodes at the transfer stages before the final transfer stage is applied to the transfer electrode at the final transfer stage.

6 Claims, 7 Drawing Sheets

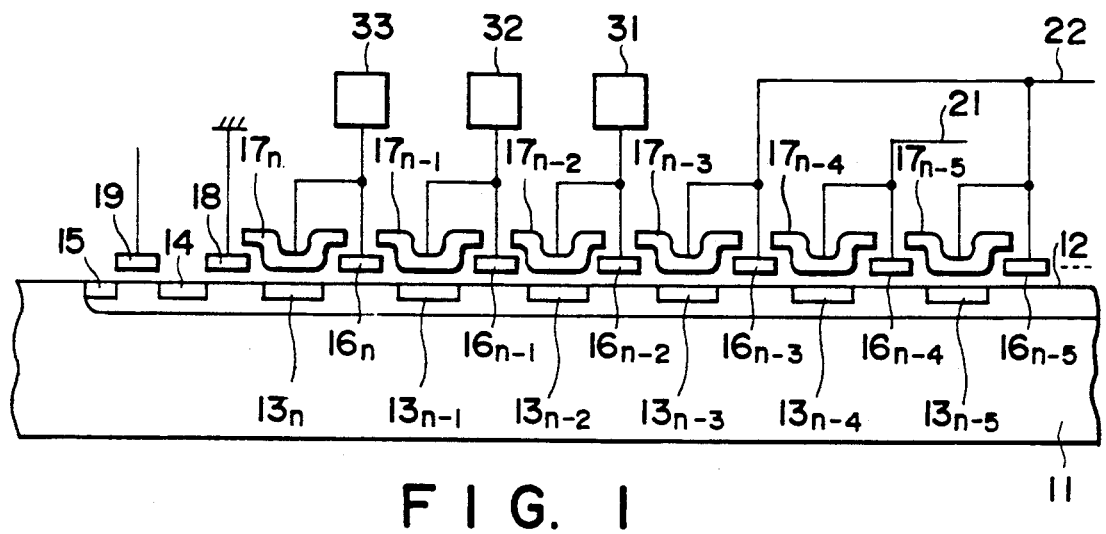
F I G. 1
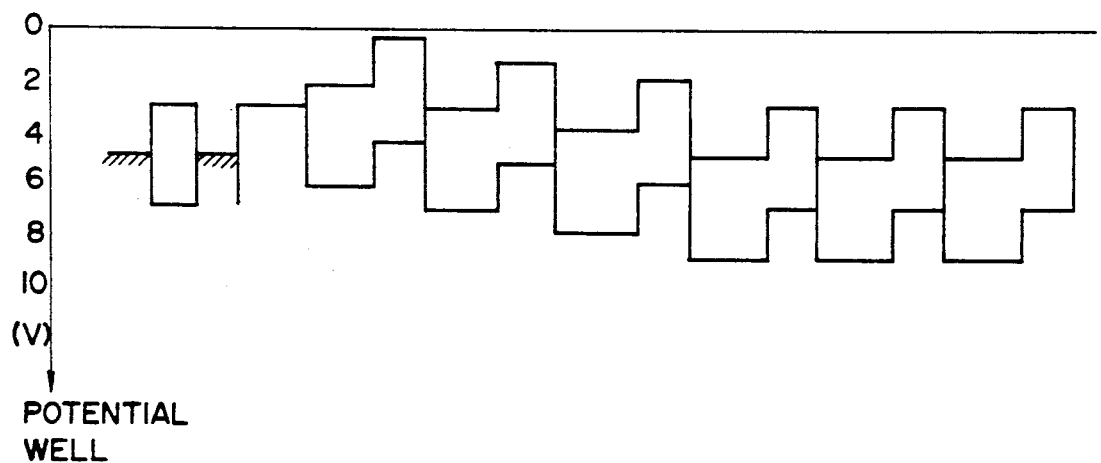
F I G. 2

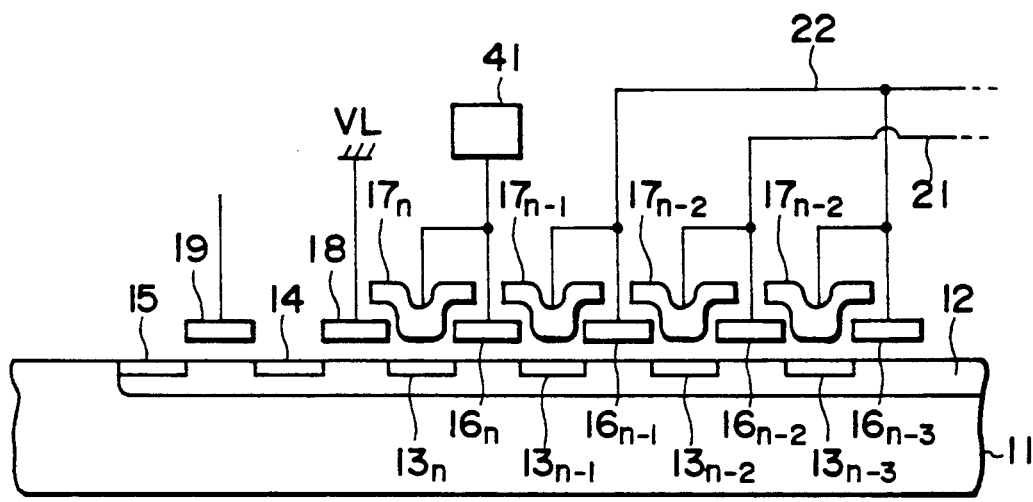
F I G. 6
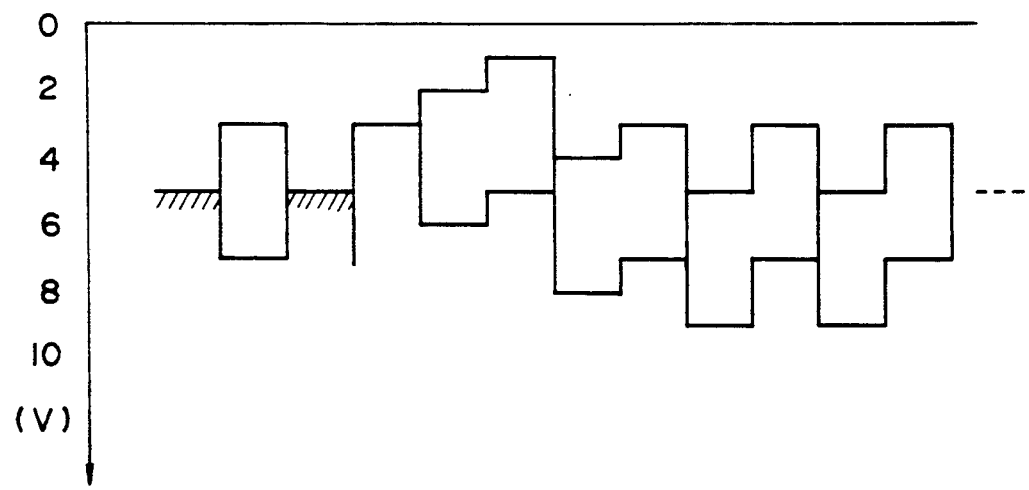
F I G. 7

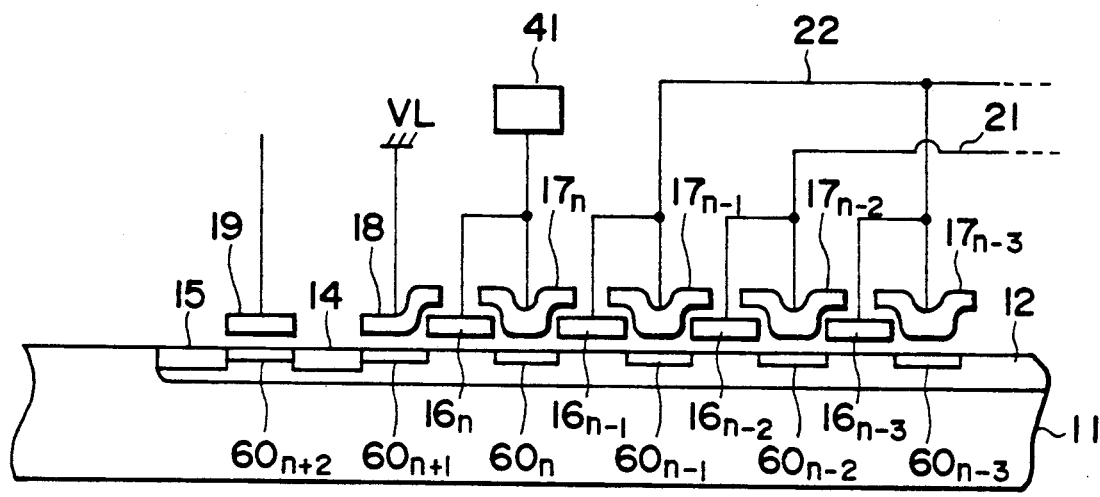
F I G. 8
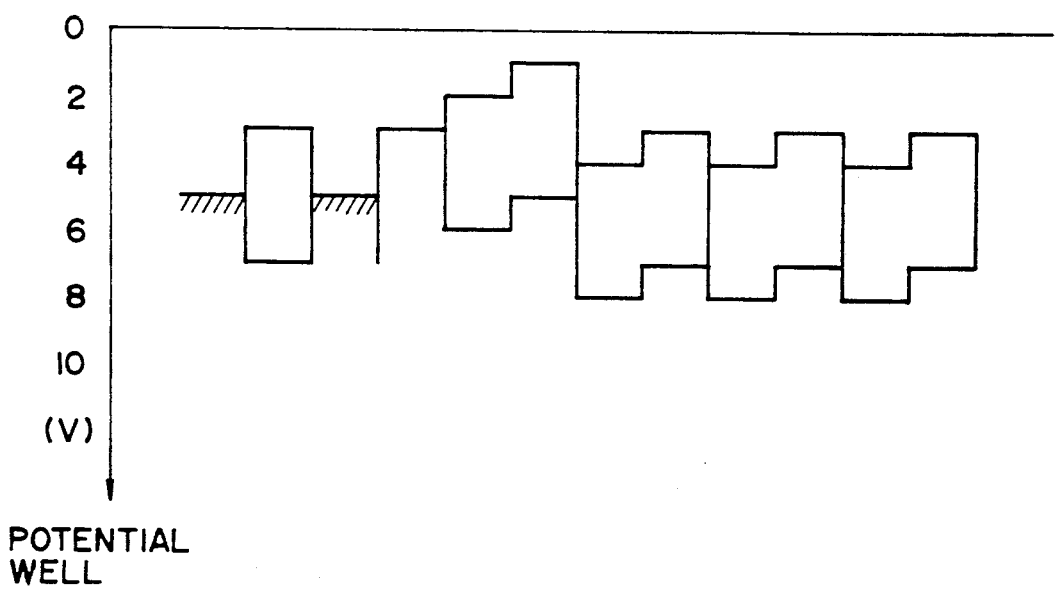
F I G. 9

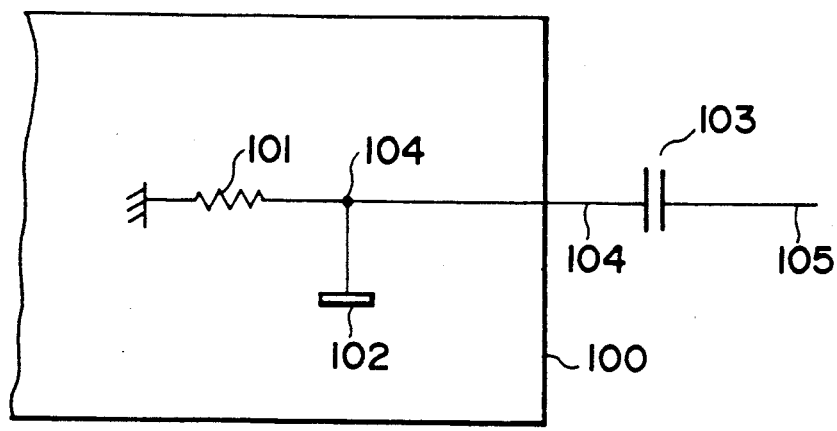
F I G. 12
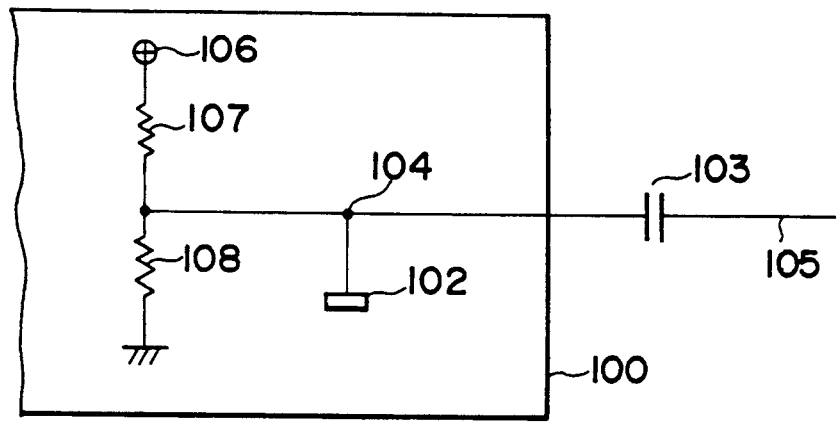
F I G. 13
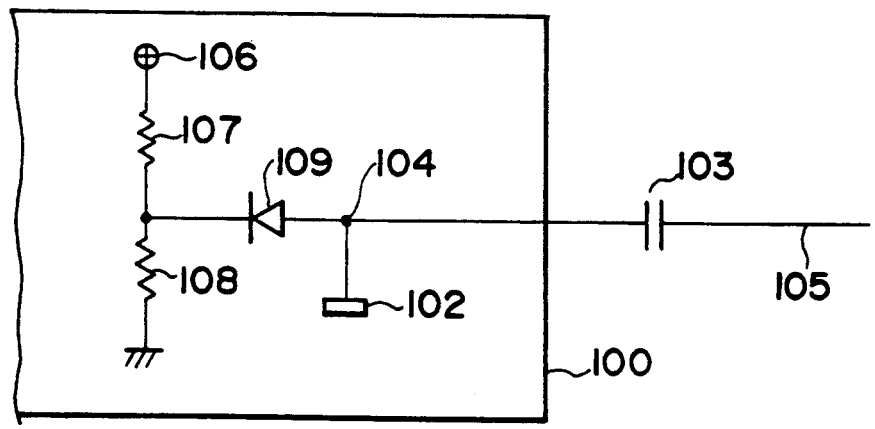
F I G. 14

CHARGE TRANSFER DEVICE AND ITS DRIVING METHOD FOR PROVIDING POTENTIAL WELLS GRADUALLY SHALLOWER TOWARD THE FINAL TRANSFER STAGE

BACKGROUND OF THE INVENTION

The present invention relates to a charge transfer device and its driving method, and more particularly to a charge transfer device driven by a low voltage.

Conventional charge transfer devices now on the market are driven by a DC supply voltage from 12 to 15 V and the transfer pulse voltage lies from 5 to 12 V in general. However, when taking into account the overall system configuration using charge transfer devices, since almost all the semiconductor devices are usually driven by 5 V, it is preferable to realize a charge transfer device (CTD) whose DC supply voltage and transfer pulse voltage for charge coupled device (CCD) registers are both 5 V (referred to as complete 5 V CTDs).

With respect to the realization of 5 V transfer pulse CTDs, since a potential difference (barrier height) between the barrier portion and the storage portion to both of which an in-phase transfer pulse is applied, can be optimized within a conventional controllable range on the basis the two-phase driving method now widely adopted as the charge transfer device driving technique, it is possible to realize satisfactory 5 V transfer pulse CTDs even if the potential difference margin is reduced during transfer operation.

With respect to the realization of 5 V DC supply voltage CTDs, the problem is how to minimize the voltage applied to the reset drains for detecting and discharging charges transferred to the output portion. Various techniques have been so far proposed with respect to the above-mentioned minimization of the reset drain voltage.

The first method is to obtain a high reset drain voltage on the basis of an internal voltage boosting circuit. That is, a high voltage is generated internally by use of a 5 V supply voltage and a 5 V pulse voltage both supplied from outside and the generated high voltage is applied to the reset drains. In this method, however, there exist problems in that a relatively-large area is required to form such a voltage generating circuit as described above, and additionally the signal S/N ratio is reduced because the generated high voltage is subjected to the influence of noise and therefore noise is superposed upon the output signal.

The second method is to directly supply an external DC supply voltage to the reset drains from outside. The typical methods are disclosed in U.S. Pat. No. 4,603,426 or in Japanese Patent Application No. 63-77676 (Japanese Patent Laid-open (Kokai) No. 1-248664) proposed by the same inventor. In more detail, U.S. Pat. No. 4,603,426 discloses such a method that the final stage is driven by a voltage from −4 to 5 V and the other stages are driven by a transfer clock pulse changing from 0 to 5 V. Japanese Patent Appli. No. 63-77676 discloses such a method where the final stage is driven by a clock pulse changing between a −3 V or less low-voltage level and a 5 V or more high-voltage level and the other stages are driven by a transfer clock pulse changing from 0 to 5 V. Further, a 5 V supply voltage is directly supplied to the reset drains in both the above-mentioned second conventional methods.

In the prior art CCD registers as described above, however, since the final transfer stage is driven by a clock pulse whose amplitude is wider than that of the externally-applied clock pulse, there exists a problem in that induced noise is easily superposed upon the CCD output signal and therefore the S/N ratio is deteriorated. Further, there exists another problem in that an additional circuit for increasing the clock pulse amplitude requires as large an area as possible for the high voltage generating circuit explained in the first conventional method.

SUMMARY OF THE INVENTION

Accordingly, the object of the present invention is to provide a highly reliable charge transfer device small in occupied area and its driving method low in driving voltage.

According to the present invention there is provided a method of driving a charge transfer device for transferring signal charges in sequence towards an output gate by changing the depth of potential wells formed under transfer electrodes in response to transfer pulses applied to the transfer electrodes at transfer stages, and which comprises the step of applying transfer pulses each having an amplitude substantially equal to that of transfer pulses applied to transfer electrodes at transfer stages before a plurality of successively-arranged transfer stages including a final transfer stage and DC offset levels that decrease gradually so as to gradually make the depth of potential wells formed under the transfer electrodes toward the final transfer stage, more shallow to transfer electrodes at the successively-arranged plural transfer stages including the final transfer stage, and a charge transfer device for transferring signal charges in sequence towards an output gate by controlling the depth of potential wells formed under transfer electrodes in response to transfer pulses applied to the transfer electrodes at transfer stages, which comprises means for applying transfer pulses each having an amplitude substantially equal to that of transfer pulses applied to transfer electrodes at transfer stages before a plurality of successively-arranged transfer stages including a final transfer stage before the output gate and DC offset levels that decreased gradually so as to gradually make the depth of potential wells formed under the transfer electrodes toward the final transfer stage more shallow, to transfer electrodes at the successively arranged plural transfer stages including the final transfer stage before the output gate.

According to the present invention there is also provided a method of driving a charge transfer device for transferring signal charges in sequence in a predetermined direction by forming potential wells under transfer electrodes in response to transfer pulses applied to the transfer electrodes at transfer stages, which comprises the step of applying a transfer pulse having an amplitude substantially equal to that of transfer pulses applied to transfer electrodes at transfer stages before a final transfer stage and a DC offset voltage so biased as to allow the depth of a potential well formed under the transfer electrode at the final transfer stage to be shallower than that of potential wells formed under the transfer electrodes at the transfer stages before the final transfer stage, to the transfer electrode at the final transfer stage before an output gate, and a charge transfer device for transferring signal charges in sequence in a predetermined direction by forming potential wells under transfer electrodes in response to transfer pulses applied to the transfer electrodes at transfer stages, which comprises means for applying a transfer pulse having an amplitude substantially equal to that of transfer pulses applied to transfer electrodes at transfer stages before a final transfer stage and a DC offset voltage so biased as to allow the depth of a potential well formed under the transfer electrode at the final transfer stage to be shallower than potential wells formed under the transfer electrodes at the transfer stages before the final transfer stage, to the transfer electrode at the final transfer stage before an output gate.

In the first aspect of the charge transfer device and its driving method according to the present invention, since transfer pulses whose DC offset levels gradually decrease are applied to the transfer electrodes in such a way that depth of potential wells formed under the transfer electrodes decreases gradually towards the final transfer stage, it is unnecessary to apply a large amplitude transfer pulse to the transfer electrode at the final stage. Therefore, it is possible to minimize the generation of induced noise, thus realizing a high-reliable charge transfer device that has a high occupied area efficiency and a driving method that has a low device driving voltage.

Further, in the second aspect of the charge transfer device and its driving method according to the present invention, since a transfer pulse whose DC offset voltage is biased is applied so that the potential well depth formed just under the transfer electrode at the final transfer stage before the output gate becomes shallower than that formed just under the transfer electrodes at the other transfer stages, it is possible to output charge signals without applying a large-amplitude transfer pulse to the transfer electrode at the final stage, thus realizing a high-reliable charge transfer device high in occupied area efficiency and its driving method low in device driving voltage.

In practice, the above-mentioned potential relationship can be obtained by determining the high level of the transfer pulse applied to the final transfer stage as $(VL+VH)/2$ and the low level thereof as $(VL-VH)/2$ and by applying a dc voltage of about VL to the output gate, where VH denotes a high voltage level of the transfer pulses applied to the transfer stages before the final transfer stage and VL denotes a low voltage level thereof.

BRIEF DESCRIPTION OF THE DRAWINGS

In the attached drawings:

FIG. 1 is a cross-sectional view showing elements of the first embodiment of the charge transfer device according to the present invention;

FIG. 2 is a potential diagram for assistance in explaining the operation of the charge transfer device shown in FIG. 1;

FIG. 6 is a cross-sectional view showing elements of the third embodiment according to the present invention;

FIG. 7 is a potential diagram for the third embodiment;

FIG. 8 is a cross-sectional view showing elements of the fourth embodiment according to the present invention;

FIG. 9 is a potential diagram for the fourth embodiment;

FIG. 12 is a circuit diagram showing a circuit for generating a voltage applied to the final stage;

FIG. 13 is a circuit diagram showing another circuit for generating a pulse applied to the final stage; and FIG. 14 is a circuit diagram showing the other circuit for generating a pulse applied to the final stage.

DETAILED DESCRIPTION OF THE PREFERRED EMBODIMENTS

Figure 3:
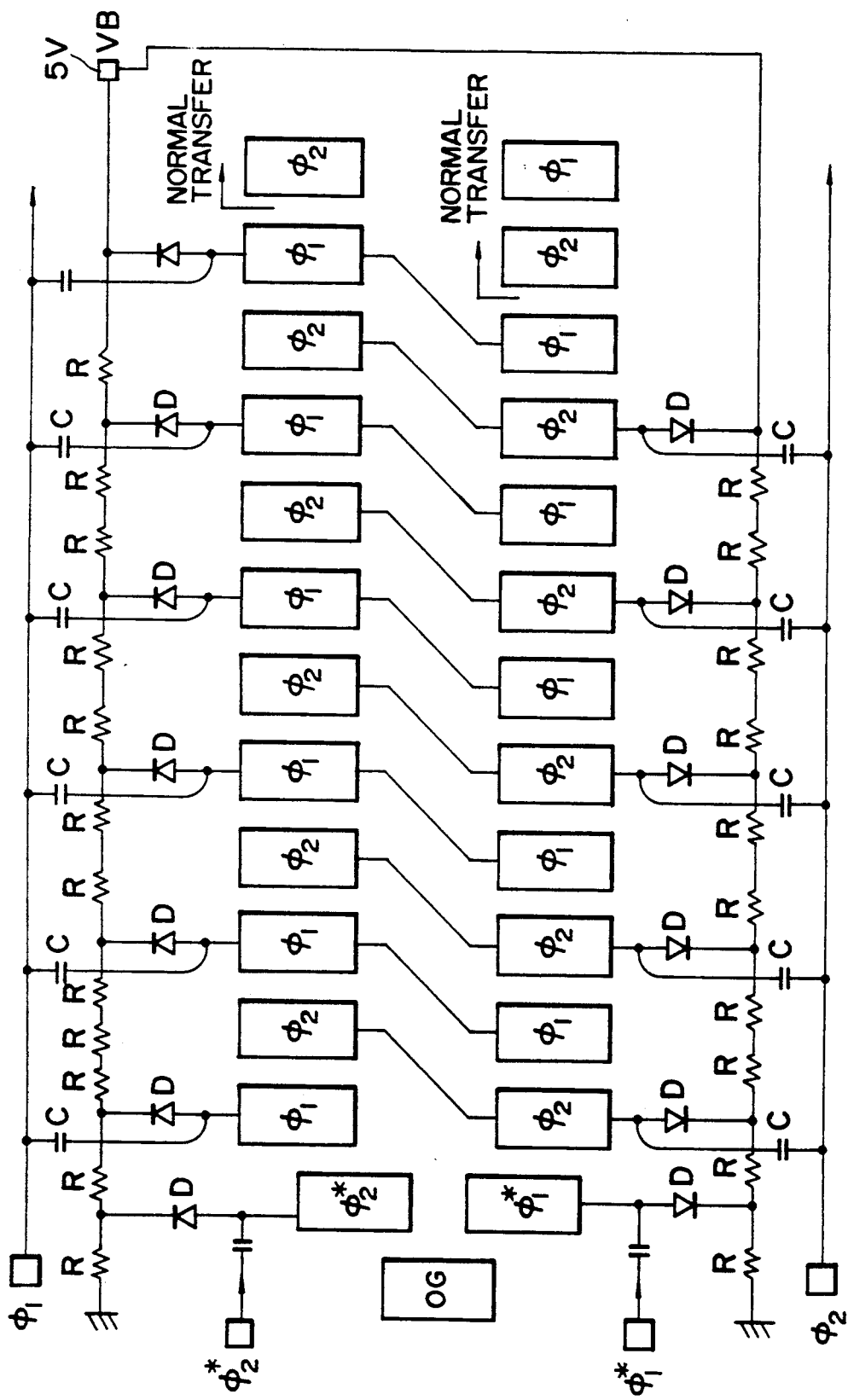
FIG. 3 is a circuit diagram showing a circuit for generating voltages to gradually change the depth of the potential wells.

A first embodiment of the charge transfer device according to the present invention will be described hereinbelow with reference to FIGS. 1 to 3.

In FIG. 1, on the upper surface of a p-type silicon semiconductor substrate, for instance, a semiconductor injection region 12 (a buried channel in which barrier and storage regions are formed) is formed by injecting n-type impurity ions of the conductivity type opposite to that of the substrate 11. Further, in the injection region 12, additional injection regions $13_1 \ldots 13_n$ (at which storage regions are formed) are formed by further injecting n-type impurity ions of the conductivity type opposite to that of the substrate 11 at high impurity atom concentration. Further, in the injection region 12 on the output side, a floating diffusion layer 14 and a reset drain 15 are respectively formed so as to include n-type impurity ions of the conductivity type opposite to that of the substrate 11 of high impurity atom concentration.

Further, transfer electrodes $16_1 \ldots 16_n$ at the first layer (only electrodes $16_{n-5}$ to $16_n$ are shown in FIG. 1) are arranged between the two adjacent additional injection regions 13 and above the injection region 12; transfer electrodes $17_1 \ldots 17_n$ at the second layer (only electrodes $17_{n-5}$ to $17_n$ are shown in FIG. 1) are arranged over each additional injection region 13: and an output gate 18 and a reset gate 19 are formed and arranged between the additional injection region $13_n$ at the final transfer stage and the floating diffusion layer 14 and between the floating diffusion layer 14 and the reset drain 15, respectively above the injection region 12.

A voltage supply wire 31 is connected to the first layer transfer electrodes $16_{n-2i}$ and the second layer transfer electrodes $17_{n-2i}$ to apply a first phase clock pulse; a voltage supply wire 22 is connected to the first layer transfer electrodes $16_{n-(2i-1)}$ and the second layer transfer electrodes $17_{n-(2i-1)}$ to apply a second phase clock pulse; and a plurality of pulse generators (three generators in FIG. 1) 31, 32 and 33 are connected to a plurality (three) of successively-arranged first-layer transfer electrodes $16_{n-2}$ to $16_n$ and to a plurality (three) of successively-arranged second layer transfer electrodes $17_{n-2}$ to $17_n$ both including the transfer electrode at the final transfer stage. These pulse generators 31, 32 and 33 can be formed on the same substrate 11 or as external circuits. The amplitude of each of pulses outputted from these pulse generators is substantially equal to that of each of clock pulses supplied via the common pulse supply wires 21 and 22; however, the high levels of the pulses from these pulse generators 31, 32 and 33 decrease gradually toward the final transfer stage. For example, when the clock pulses supplied via the common pulse supply wires 21 and 22 are at 0 V in low level and at 5.0 V at high level, the three pulses generated by the pulse generators 31, 32 and 33 are determined so as to be at $-1.0$ V, $-2.0$ V and $-3.0$ V, respectively in low level and at 4.0 V, 3.0 V and 2.0 V, respectively in high level.

FIG. 3 shows a circuit for generating pulses whose voltage levels change in sequence as described above, by way of example. In the circuit shown, a fixed potential VB of 5 V is divided by a plurality of resistors R; a cathode of each of diodes D is connected to each junction point between two adjoining single or plural resistors; and a transfer pulse $\phi 1$ is applied to an anode of each of the diodes D via a capacitor C to synthesize plural divided voltages, so that the pulse $\phi 1$ whose voltage changes at each transfer stage can be obtained. In the same circuit configuration, it is also possible to obtain a pulse $\phi 2$ whose voltage changes at each transfer stage. The circuit as shown in FIG. 3 can be formed on the same charge transfer device or externally.

FIG. 2 shows the depth of potential wells formed under the transfer electrodes 16 and 17 when the above-mentioned pulses are applied to the transfer electrodes 16 and 17 formed in the charge transfer device shown in FIG. 1. FIG. 2 indicates that the depth of the potential wells formed under the transfer electrodes 16 and 17 connected to the pulse generators 31, 32 and 33 decreases gradually toward the final transfer stage.

As described above, in the present embodiment, it is possible to reduce the reset drain voltage without applying pulses with a large amplitude. As a result, it is possible to minimize the generation of induced noise and therefore provide a high-reliable charge transfer device driven by a low voltage.

Figure 4:
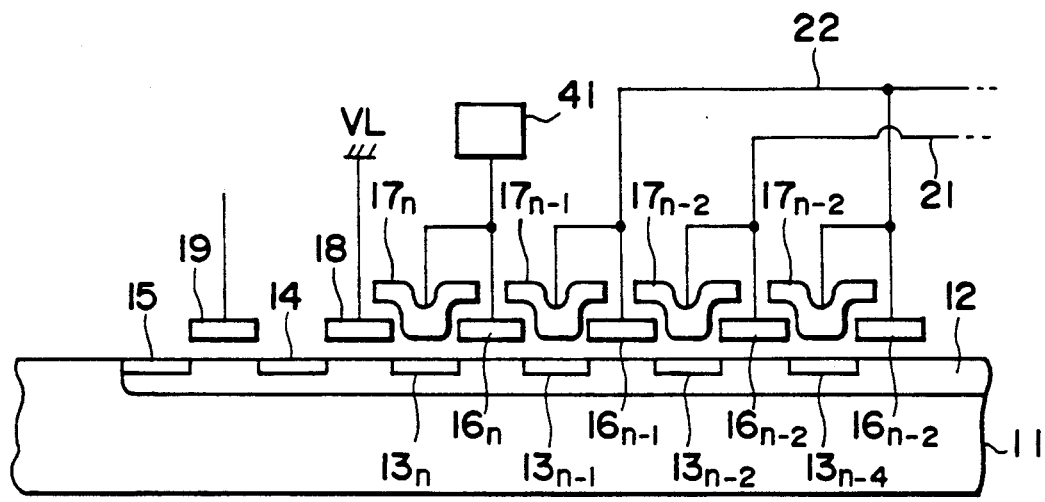
FIG. 4 is a cross-sectional view showing elements of the second embodiment according to the present invention.

FIG. 4 is a cross-sectional view showing elements of a second embodiment of the present invention. The same reference numerals shown in FIG. 1 have been retained for similar elements shown in FIG. 4 and having the same functions. The difference between the first and second embodiments is that a clock generator 41 is connected to only the final transfer stage in FIG. 4.

In this second embodiment, the barrier difference (in potential between the barrier portion and the storage portion) is determined on the basis of a difference in potential well depth between the buried channel region 12 under the electrode 16 and the additional injection region 13 under the electrode 17. In other words, it is possible to control the barrier height on the basis of the impurity atom concentration at the additional injection region 13.

The final stage clock pulse generator 41 generates a pulse in such a way that the amplitude thereof is substantially equal to that of the transfer pulses applied to the transfer electrodes at transfer stages other than the final stage and further the depth of potential wells under the electrodes $16_n$ and $17_n$ at the final stage are determined to be shallower than that under the electrodes at stages other than the final stage. For example, in this embodiment, the pulse applied to the final stage electrodes $16_n$ and $17_n$ changes from $-2.5$ V to 2.5 V, while the pulse applied to the transfer electrodes $16_1$ to $16_{n-1}$ and $17_1$ to $17_n$ other than the final stage transfer electrodes changes from 0 to 5 V. In general, it is preferable to determine the high level of the transfer pulse applied to the final transfer stage electrodes as $(VL+VH)/2$ and the low level thereof as $(VL-VH)/2$ and to apply a dc voltage of about VL to the output gate, where VH denotes a high voltage level of the transfer pulse applied to the transfer stages before the final transfer stage and VL denotes a low voltage level thereof.

Figure 5:
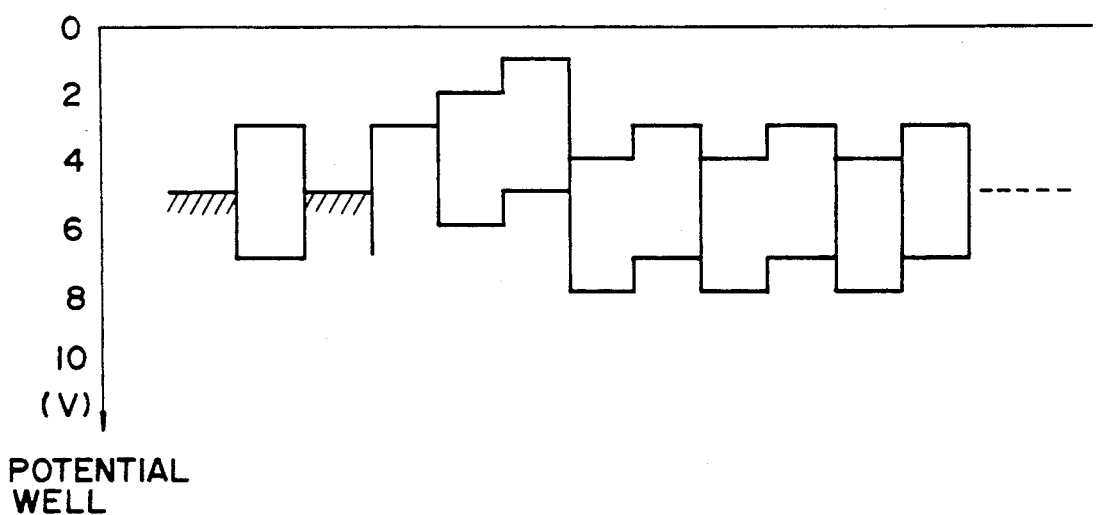
FIG. 5 is a potential diagram for the second embodiment.

FIG. 5 shows the depth of potential wells obtained when the charge transfer device shown in FIG. 4 is driven by the above-mentioned 2-phase clock signals, in which the reset drain 15 is determined at $-5$ V; the barrier height between the barrier portion 16 and the storage portion 13 is 1.0 V; and the modulation factor representing a proportion of the potential well depth to the voltage applied to the gate electrode is 0.8.

FIG. 5 indicates that the potential difference generated when signal charge is transferred from the charge storage portion at the transfer stage which is one stage before the final transfer stage is 1.0 V. The potential difference generated when signal charge is transferred from the charge storage portion at the final transfer stage to the output gate is also 1.0 V. These potential differences are sufficient for normal charge transfer operation.

FIGS. 6 and 7 show a third embodiment according to the present invention, which is similar to the second embodiment shown in FIG. 4 in that the impurity atom concentration at the additional injection regions 13 formed on the surface of the buried channel range 12 is the same at the final stage and the stage one stage before the final stage. However, a different point between the second and this third embodiment is that the barrier difference is determined to be larger at the stages $23_1$ to $23_{n-2}$ before the stage one before the final stage. Further, a clock pulse is applied from the final stage clock pulse generator 41 to the final stage transfer electrodes $16_n$ and $17_n$ in the same way as in the second embodiment.

FIG. 7 shows the depth of potential wells obtained when the charge transfer device shown in FIG. 6 is driven by the 2-phase clock signals. FIG. 7 indicates that the barrier height is small at the final stage and the stage one before the final stage.

Where the device is formed with small barrier heights all over the device as in the second embodiment shown in FIG. 4, a relatively large CCD register width is required to transfer a sufficient quantity of signal charges. However, since a sufficient potential difference can be secured at the transfer stages, except the final stage and the stage one before the final stage, even if a large barrier difference is set, it is not necessarily to reduce the barrier difference all over the device. As described above, it is possible to reduce the register width by determining large barrier heights at the transfer stages except the final stage and the stage one before the final stage, so that parasitic capacitance can be reduced. Further, it is also possible to reduce the register width by increasing the length L of the charge storage portion.

In the charge transfer device formed as described above, since the allowable range of variance in the barrier difference at the final stage and the stage one before the final stage is narrower than that at the other transfer stages, it is preferable to form both stages separately, without forming all the transfer stages simultaneously.

FIGS. 8 and 9 show a fourth embodiment according to the present invention. In this embodiment, the electrodes $17_1$ to $17_n$, the output gate 18 and the reset gate 19 are all formed as a second layer polysilicon over first barrier layers $60_1$ to $60_{n+2}$ formed by injecting impurity ions of the conductivity type the same as that of the substrate 11 on the surface of the buried channel layer 12. Further, a floating diffusion region 14 is formed between the two barrier layers $60_{n+1}$ and $60_{n+2}$, and a reset drain 15 is formed inside the barrier layer $60_{n+2}$, respectively. Therefore, the functions of the first polysilicon layer and those of the second polysilicon layer are intercharged as compared with the second and third embodiments shown in FIGS. 4 and 6. Further, in this fourth embodiment, a clock pulse is applied from a final stage clock pulse generator 41 to the final stage transfer electrodes $16_n$ and $17_n$ in the same way as with the second embodiment.

FIG. 9 shows a potential diagram of this fourth embodiment, in which the reset drain is set to 5 V; the barrier difference at the barrier layer 60 is 1.0 V; and the modulation factor of the potential well depth to the voltage applied to the gate electrode is determined as 0.8. Therefore, the potential well depth diagram shown in FIG. 9 during charge transfer of this fourth embodiment shown in FIG. 8 is quite the same as that shown in FIG. 5 of the second embodiment shown in FIG. 4.

Figure 10:
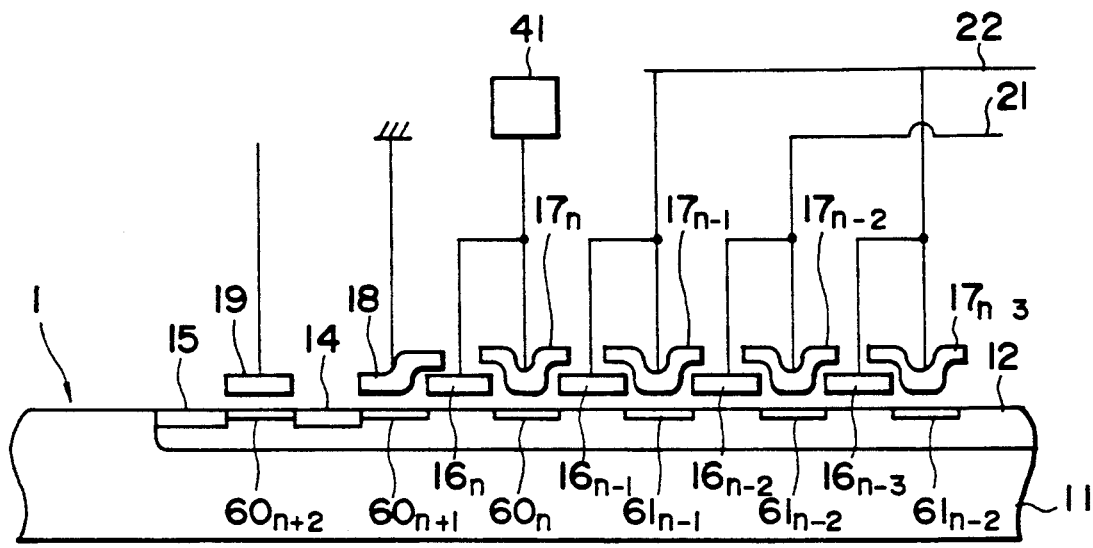
FIG. 10 is a cross-sectional view showing elements of the fifth embodiment according to the present invention.
Figure 11:
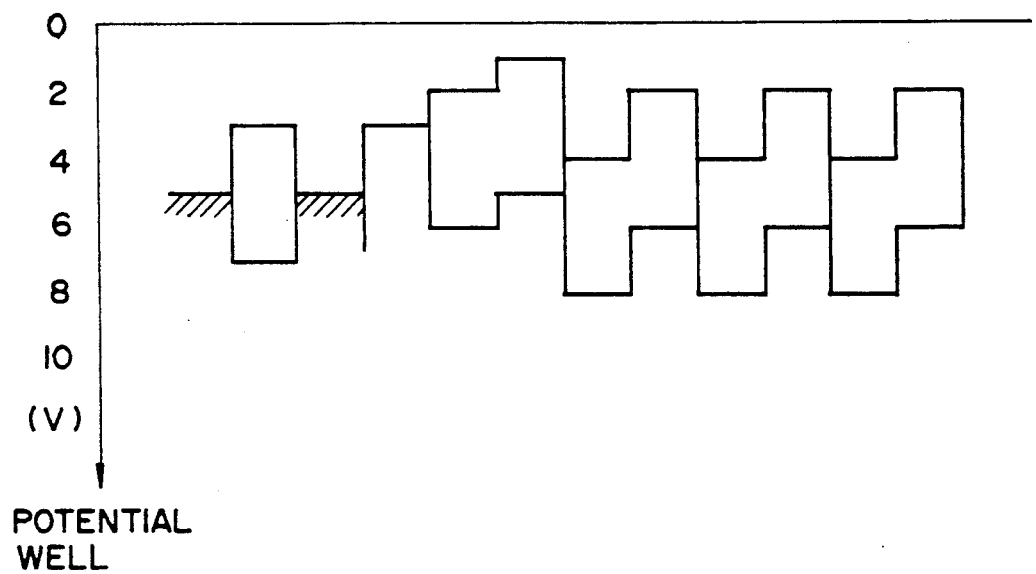
FIG. 11 is a potential diagram for the fifth embodiment.

FIGS. 10 and 11 show a fifth embodiment according to the present invention. Although being similar to the fourth embodiment, a different point between the fourth and fifth embodiment is that the first barrier layers $61_1$ to $61_{n-1}$ are formed, under the transfer stages except the final stage of the second polysilicon layer, by injecting impurity ions of the conductivity type the same as that of the substrate 11 in such a way that the barrier differences at the transfer stages other than the final stage are determined larger than that at the final stage.

In this embodiment, the functions of the first polysilicon layer and those of the second polysilicon layer are interchanged as similar manner as the fourth embodiment.

Therefore, as shown in FIG. 11, the barrier differences at the transfer stages before the final stage are determined larger than that at the final stage as 2 V, it is possible to reduce the transfer register width and the parasitic capacitance as in the third embodiment.

FIGS. 12 to 14 are circuit diagrams showing some examples of the final transfer stage clock pulse generators incorporated with the second to fifth embodiments of the present invention, in which a reference numeral 100 denotes a semiconductor chip.

In the example shown in FIG. 12, a resistor 101 whose one end is grounded is connected in series to an offset-biasing capacitor to which a pulse changing between 0 and 5 V is applied. An intermediate junction point 104 between the resistor 101 and the capacitor 103 is connected to a final stage gate 102 as the final stage pulse inputting terminal. Since the pulse voltage from 0 to 5 V applied to the capacitor 103 can be reduced by a voltage of 2.5 V, for instance due to the resistor clamping operation, a pulse ranging between −2.5 V and 2.5 V is applied to the final stage gate 102.

In the example shown in FIG. 13, two resistors 107 and 108 are connected in series between a supply voltage 106 and the ground, and an offset-biasing capacitor 103 is connected to a junction point between the two resistors 107 and 108. Therefore, the upper and lower limit voltage values applied to the final stage gate 102 change according to the values of the dividing resistors 106 and 107. However, the voltage range between the upper and lower limit values will not change.

In the example shown in FIG. 14, a diode 109 is connected between the junction point between the two resistors 107 and 108 and the intermediate junction point 104 to realize a so-called diode-clam type circuit. The clamping operation of this circuit is substantially the same as that shown in FIG. 13.

As described above, in the charge transfer device and its driving method according to the present invention, since the potential well depth at a plurality of transfer stages including the final stage is so determined as to become shallower gradually toward the final transfer stage, it is unnecessary to apply a large-amplitude pulse at the final transfer stage, so that it is possible to drive the charge transfer device at a high reliability by a low voltage. In addition, it is possible to realize a charge transfer device occupying a small area.

Further, in the charge transfer device and its driving method according to the present invention, since the biased transfer pulse is applied in such a way that the potential well depth becomes shallow only at the final transfer stage and the amplitude is the same as at the other transfer stages, it is also possible to drive the charge transfer device of a small occupied area by a low voltage and with a high reliability.

It is to be noted that for the charge transfer device shown in FIG. 1, the functions of the first polysilicon layer and those of the second polysilicon layer may be interchanged as shown in the embodiments according to FIGS. 8 and 10.

What is claimed is:

1. A method of driving a charge transfer device for transferring signal charges in sequence toward an output gate by controlling the depths of potential wells formed under transfer electrodes of a first plurality of transfer stages and a second plurality of transfer stages which includes a final transfer stage in response to a first and second plurality of transfer pulses, respectively, applied to said transfer electrodes of said first and second plurality of transfer stages, wherein:

each of said transfer pulses of said first and said second plurality of transfer pulses is characterized by a DC offset and an amplitude, said amplitude being the voltage difference between the transfer pulse maximum and minimum;

said second plurality of transfer pulses are applied to said transfer electrodes of said second plurality of transfer stages and said amplitude of each of said second plurality of transfer pulses is substantially equal to that of said first plurality of transfer pulses which are applied to said transfer electrodes of said first plurality of transfer stages; and said DC offset levels of said second plurality of transfer pulses are decreased gradually to make the depth of potential wells at said second plurality of transfer stages gradually shallower in a direction from said first plurality of transfer stages toward said final transfer stage wherein the potential well at said final transfer stage is shallowest.

2. A method for driving a charge transfer device as recited in claim 1, wherein the depths of potential wells at said first plurality of transfer stages are equal to one another.

3. A charge transfer device for transferring signal charges in sequence toward an output gate by controlling the depths of potential wells formed under transfer electrodes of a first plurality of transfer stages and a second plurality of transfer stages which includes a final transfer stage in response to a first and second plurality of transfer pulses, respectively, applied to said transfer electrodes of said first and second plurality of transfer stages, which comprises:

a means for applying said second plurality of transfer pulses, each having an amplitude substantially equal to that of said first plurality of transfer pulses applied to said transfer electrodes at said first plurality of transfer stages, to said electrodes at said second plurality of transfer stages, said amplitude being the voltage difference between the transfer pulse maximum and minimum; and means for controlling DC offset levels of said second plurality of transfer pulses applied to said transfer electrodes of said second plurality of transfer stages to make the depth of potential wells at said second plurality of transfer stages gradually shallower toward said final transfer stage wherein the potential well at said final transfer stage is shallowest.

4. A charge transfer device for transferring signal charges in sequence toward an output gate by controlling the depths of potential wells formed under transfer electrodes, comprising:

a plurality of transfer stages arranged in sequence toward a final transfer stage which is adjacent said output gate;

a means for supplying a plurality of transfer pulses to said transfer electrodes of each of said transfer stages; and a DC offset controller which controls the DC offset of said plurality of transfer pulses such that said DC offset of said transfer pulses supplied to a selected number of transfer stages, said selected number of transfer stages being made up of plural adjacent ones of said plurality of transfer stages, including said final transfer stage, is gradually decreased in steps toward said final transfer stage so as to make the depths of potential wells at said selected number of transfer stages gradually shallower toward said final transfer stage wherein the potential well at said final transfer stage is shallowest.

5. A charge transfer device for transferring signal charges as recited in claim 4, wherein said plurality of transfer pulses all have a substantially equal amplitude, said amplitude being the voltage difference between the transfer pulse maximum and minimum.

6. A charge transfer device for transferring signal charges as recited in claim 4, wherein the DC offset controller controls the DC offset of transfer stages other than the selected number of transfer stages so that the depths of potential wells at said transfer stages other than said selected number of transfer stages are equal.

* * * * *